United States Patent [19]

Figura

[11] Patent Number: 5,696,014
[45] Date of Patent: Dec. 9, 1997

[54] METHOD FOR INCREASING CAPACITANCE OF AN HSG RUGGED CAPACITOR USING A PHOSPHINE RICH OXIDATION AND SUBSEQUENT WET ETCH

[75] Inventor: Thomas A. Figura, Boise, Id.

[73] Assignee: Micron Semiconductor, Inc., Boise, Id.

[21] Appl. No.: 209,659

[22] Filed: Mar. 11, 1994

[51] Int. Cl.$^6$ .................................................. H01L 21/00
[52] U.S. Cl. .................... 437/52; 437/60; 437/228; 437/919; 437/977; 148/14; 148/138; 156/657.1; 156/662.1
[58] Field of Search ............................ 156/657.1, 662.1; 437/228, 919, 977, 52, 60; 148/14, 138; 257/309

[56] References Cited

U.S. PATENT DOCUMENTS

| | | | |
|---|---|---|---|
| 5,318,920 | 6/1994 | Hayashide | 437/977 X |
| 5,372,962 | 12/1994 | Hirota et al. | 437/919 X |

*Primary Examiner*—Thi Dang
*Attorney, Agent, or Firm*—Susan B. Collier

[57] ABSTRACT

A capacitor and method for forming the capacitor having HSG polysilicon with reduced dielectric bridging, increased capacitance, and minimal depletion effects. A first polysilicon layer is deposited and doped with impurities to increase conductivity. A second polysilicon layer is deposited at a temperature adjusted to cause a nucleation of the second polysilicon layer. As a result of the nucleation the second polysilicon layer is altered to resemble hemispherical grains. Next the first and second polysilicon layers are oxidized in an oxygen/phosphine ambient. During the oxidation portions of the first and second polysilicon layers are consumed forming a phosphine rich oxide layer on the surface of the hemispherical grains and in portions of the first polysilicon layer lying between the grains which are reduced in size due to the oxidation. A wet etch is then performed to remove the oxide layer. Phosphorous ions are driven into the hemispherical grains during the oxidation thereby doping the grains. The oxidation is controlled such that the surface area of the hemispherical grains and first polysilicon layer retain a roughened surface area that is at least equal to a surface area of the hemispherical grains prior to the oxidation. The size of the grains decreases and the distance between the grains increases as a result of the oxidation. Following the etch a dielectric layer is deposited to overlie the rough polysilicon. The thickness of the dielectric layer tends to be uniform due to the smaller grains and greater distance between the grains. The process is completed with a deposition of a cell plate layer overlying the dielectric layer. Depletion is reduced or eliminated due to the doping of the grains.

16 Claims, 13 Drawing Sheets

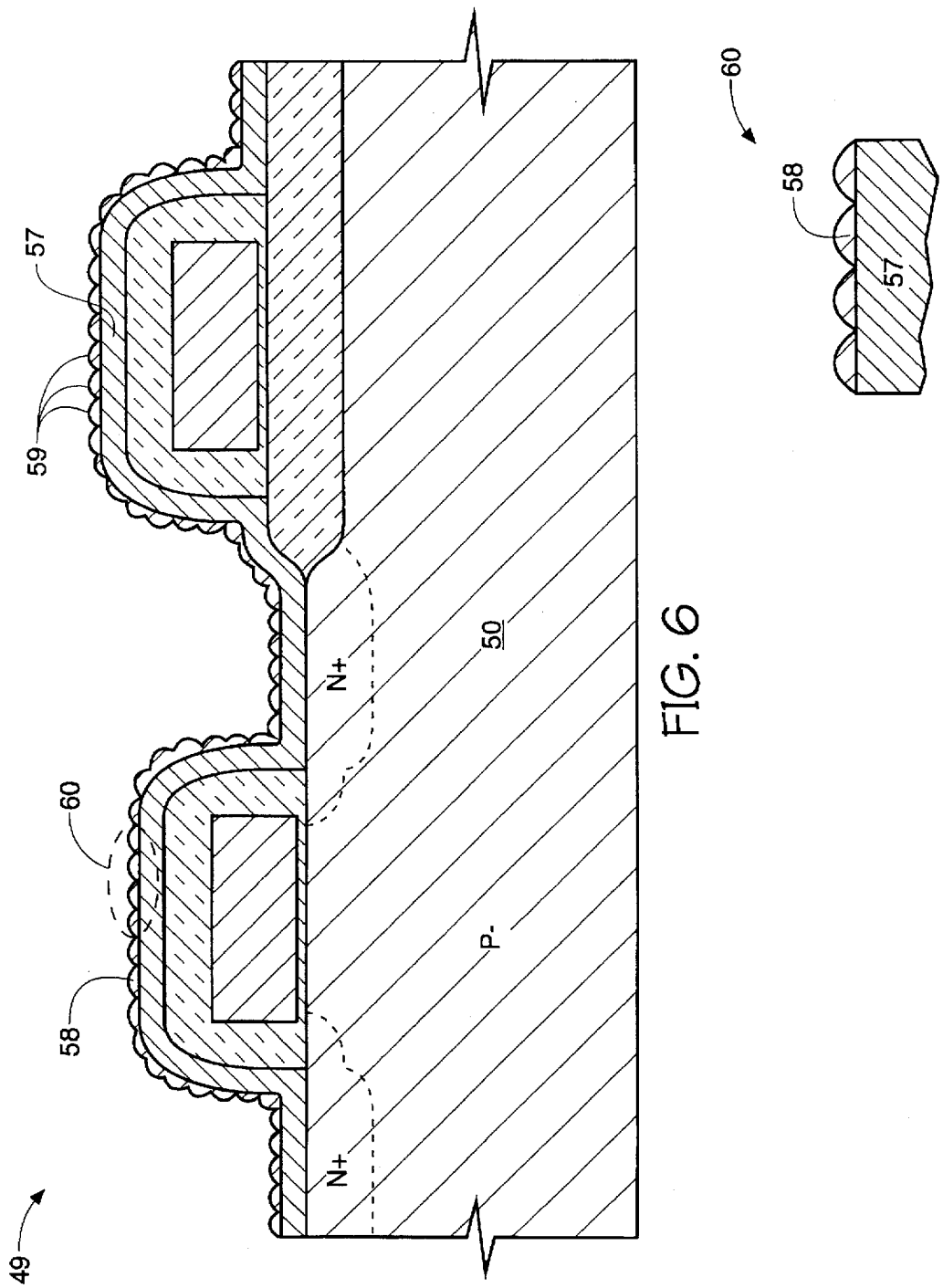

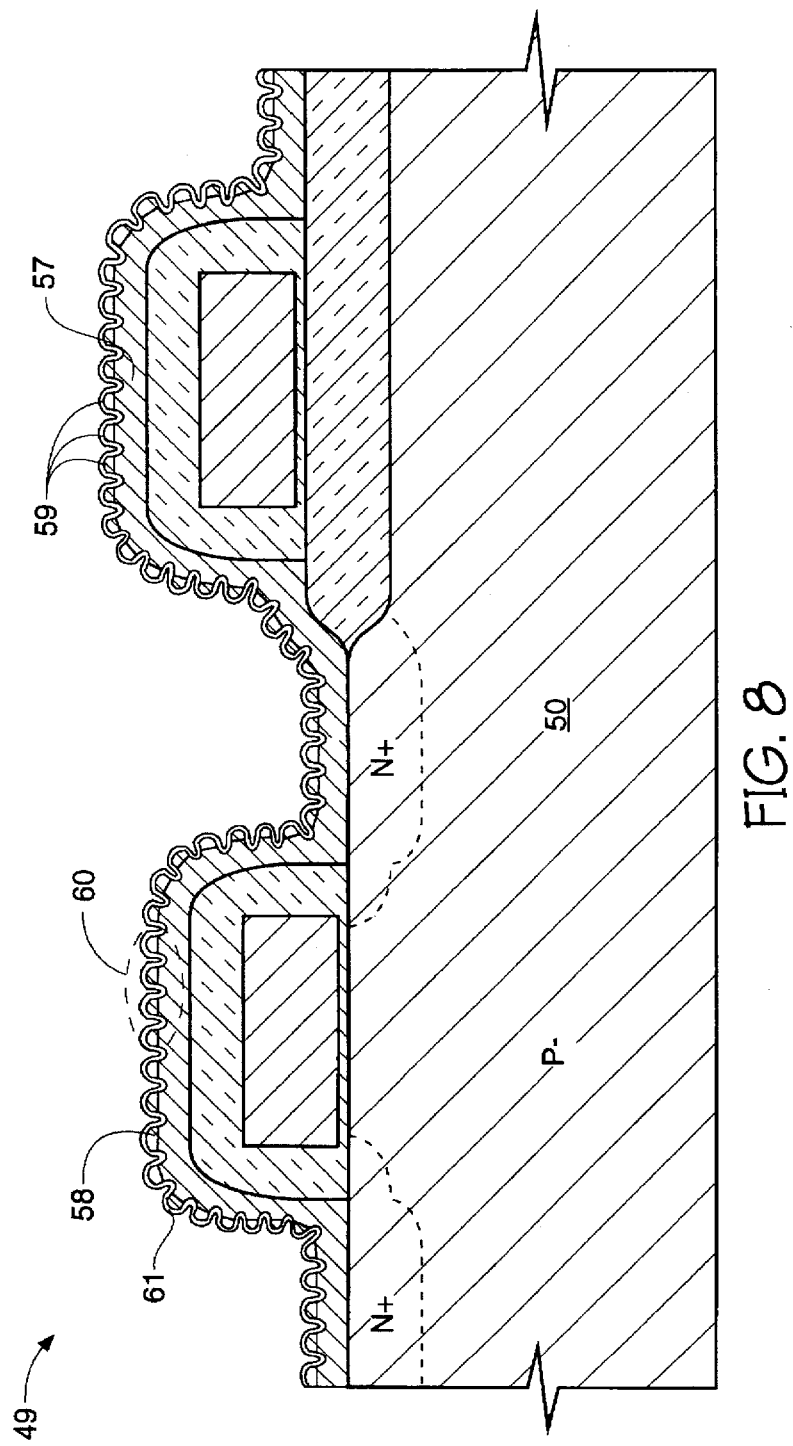
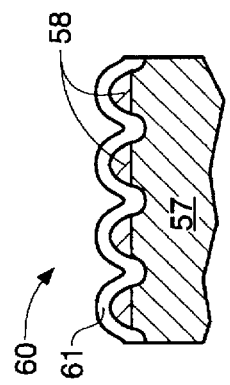
FIG. 8
FIG. 9

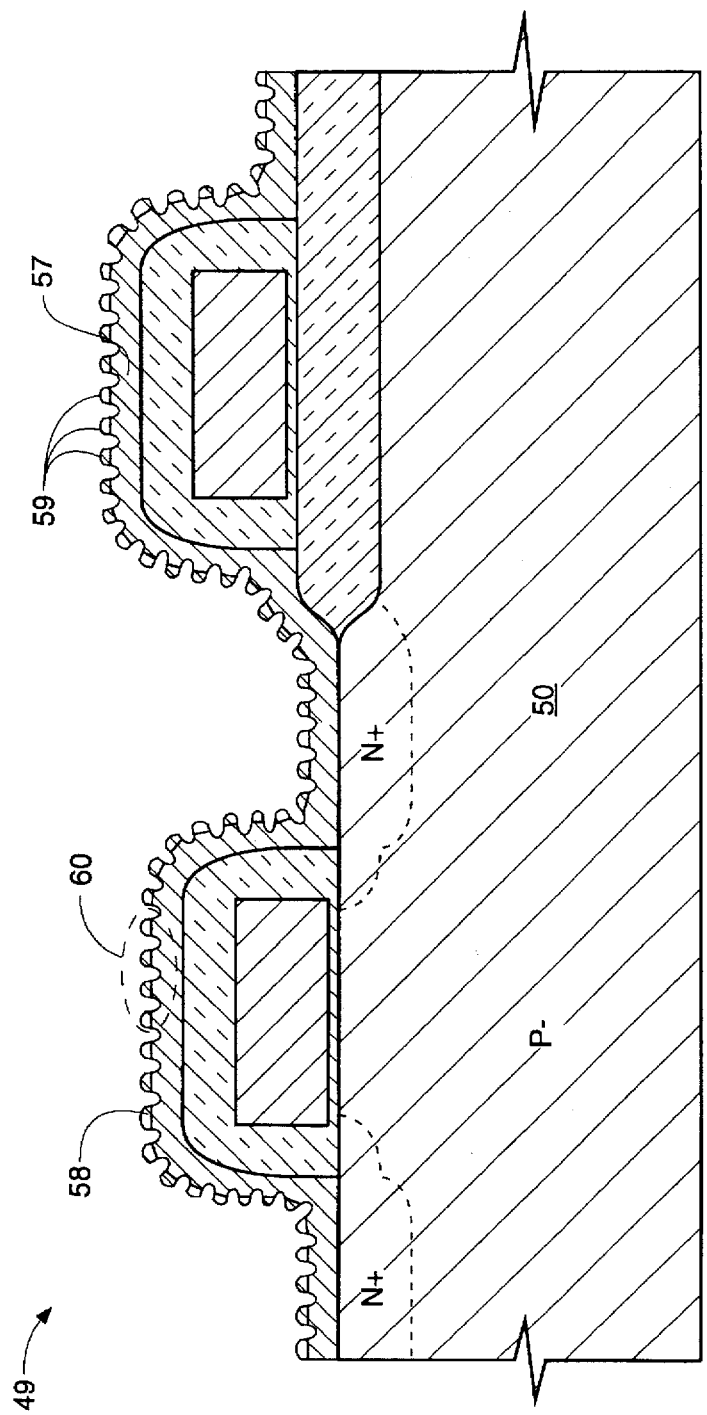
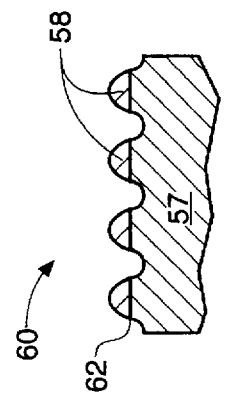
FIG. 10
FIG. 11

METHOD FOR INCREASING CAPACITANCE OF AN HSG RUGGED CAPACITOR USING A PHOSPHINE RICH OXIDATION AND SUBSEQUENT WET ETCH

CROSS REFERENCE TO RELATED APPLICATIONS

This application is being filed simultaneously with copending application having disclosure number 93-455 entitled "A METHOD FOR INCREASING CAPACITANCE OF AN HSG RUGGED CAPACITOR USING A POST DEPOSITION WET ETCH." The two applications may contain similar material.

FIELD OF THE INVENTION

This invention relates to semiconductor technology and, more specifically, to the design of capacitors used in dynamic random access memory cells.

BACKGROUND OF THE INVENTION

The invention uses various materials which are electrically either conductive, insulative or semi-conductive, although the completed circuit device itself is usually referred to as a "semiconductor."

The memory cells of dynamic random access memories (DRAMs) are comprised of two main components: a field-effect transistor and a capacitor. In DRAM cells utilizing a conventional planar capacitor (such as the one depicted in FIG. 1), far more chip surface area is dedicated to planar capacitor 11 than to field-effect transistor (FET) 12. The gate 13 of FET 12 and the word line 14 are formed from an etched polycrystalline silicon layer. Bit line 15 connects with access-node junction 16. Capacitor 11 has a lower plate formed from the n+ silicon substrate extension 17 of storage node junction 18 of FET 12. Upper capacitor plate (or field plate) 19 is formed from a layer of conductively-doped polycrystalline silicon. Substrate extension 17 is electrically insulated from upper plate 19 by a dielectric layer 20. Planar capacitors have generally proven adequate for use in DRAM chips up to the one-megabit level. However, planar capacitors constructed with conventional dielectric materials appear to be unusable beyond the one-megabit DRAM level. As component density in memory chips has increased, the shrinkage of cell capacitor size has resulted in a number of problems. Firstly, the alpha-particle component of normal background radiation will generate hole-electron pairs in the n+ silicon substrate plate of a cell capacitor. This phenomena will cause the charge within the affected cell capacitor to rapidly dissipate, resulting in a "soft" error. Secondly, as cell capacitance is reduced, the sense-amp differential signal is reduced. This aggravates noise sensitivity and makes it more difficult to design a sense-amp having appropriate signal selectivity. Thirdly, as cell capacitance is decreased, the cell refresh time must generally be shortened, thus requiring more frequent interruptions for refresh overhead. The difficult goal of a DRAM designer is therefore to increase or, at least, maintain cell capacitance as cell size shrinks, without resorting to processes that reduce product yield or that markedly increase the number of masking and deposition steps in the production process.

Several methods for providing adequate cell capacitance in the face of shrinking cell size are either in use or under investigation. Basically, the efforts fall into two categories. Efforts within the first category are aimed at creating complex three-dimensional capacitors; those within the second are aimed at improving the dielectric of the planar capacitor.

One three-dimensional technique involves the creation of "trench" capacitors in the cell substrate. FIG. 2 depicts a DRAM cell having a typical trench capacitor 21. Similar in concept to planar capacitor 11 of FIG. 1, the trench is employed to provide greater plate area, and hence, greater capacitance. The lower plate 22 may be formed from the n+ doped silicon substrate or it may be formed from a polysilicon layer which lines a trench cut in the n+ doped silicon substrate. The upper plate 23 is formed from a layer of conductively-doped polycrystalline silicon (poly). Lower plate 22 and upper plate 23 are electrically insulated from each other with a dielectric layer 24. DRAM chips employing trench capacitors have been built by a number of European, Japanese and U.S. companies, including IBM Corporation, Texas Instruments, Inc., Nippon Electric Company, Toshiba, Matsuchita and Mitsubishi Electric Corporation. There are several problems inherent in the trench design, not the least of which is trench-to-trench capacitive charge leakage which is the result of a parasitic transistor effect between trenches. Another problem is the difficulty of completely cleaning the capacitor trenches during the fabrication process; failure to completely clean a trench will generally result in a defective cell.

Another three-dimensional technique, which is being used by most DRAM manufactures including, Micron Semiconductor, Nippon Electric Company (NEC), Samsung, Goldstar, Hyundai, Mitsubishi Electric Corporation, Hitachi, and Fujitsu, Ltd., is the stacking of capacitor plates between dielectric layers on the DRAM cell surface. FIG. 3 is a graphic representation of a typical DRAM cell having a stacked capacitor 31. The lower plate 32 is formed from an n-type polycrystalline silicon layer which is in contact with the silicon substrate 33 in the region of the FET storage node junction, while the upper plate 34 is formed from a conductively-doped polycrystalline silicon layer. The two layers are separated by a dielectric layer 35. Lower or storage node plate 32 and upper plate 34 are both stacked on top of FET 12 and word line 36, resulting in a high-profile cell which requires more stringent process control for the connection of bit line 37 to access-node junction 38.

In one variation of the stacked capacitor, which is currently being used by NEC, Micron, Samsung, Matsushita, and other DRAM manufacturers, the storage node plate of the stacked capacitor is a rough polysilicon layer called hemispherical (HSG) polysilicon. This layer is formed at a critical temperature and pressure at which an anomalous nucleation occurs, causing the surface to roughen. The HSG poly provides a much larger surface area than planar poly. However the benefits of HSG poly are not fully utilized because the grains, as shown in an enlarged exaggerated cross-sectional view in FIG. 4 of deposited HSG poly 47, are so close together that the dielectric layer 48 deposited to overlie the HSG poly 47 bridges between the grains. The dielectric layer 48 in the bridged area is often as thick as 400 angstroms. Therefore a method is needed to reduce the bridging of the dielectric 48 between the grains of the HSG polysilicon 47 while maintaining the increased capacitive area provided by the HSG poly 47.

There also exists a need to reduce depletion effects in order to reduce the refresh rate required to refresh the part.

SUMMARY OF THE INVENTION

The present invention is applicable to DRAM cell designs, such as the stacked capacitor design heretofore described, a poly-lined trench design, a container cell or any designs that utilize a conductively-doped polycrystalline layer for the storage node, or lower capacitor plate. The invention is a capacitor and method for forming HSG poly with increased capacitance, reduced dielectric bridging, and reduced depletion effects.

A doped first polysilicon layer is deposited on a starting surface. A second polysilicon layer is then deposited to overly the first polysilicon layer. The temperature and pressure of the second polysilicon layer is selected in a range wherein hemispherical grain (HSGs) polysilicon is formed during the deposition. Thus the surface of the second polysilicon layer is roughened as a result of nucleation.

Next a modified phosphorous deposition is performed. The modified deposition comprises an oxidation of the HSG layer performed in a oxygen/phosphine environment which results in a growth of a phosphorous rich oxide layer overlying the HSG polysilicon and the first polysilicon layer, the oxidation consumes a portion of the first polysilicon layer and a portion of the second polysilicon layer. The oxidation is performed in a diffusion tube, rapid thermal processing chamber, or other equipment.

The oxide growth is controlled to optimize the HSG poly consumption such that when the oxide is removed during a wet etch a roughened HSG surface is retained having smaller hemispherical grains and separation of the hemispherical grains. Thus the oxide growth increases the surface area and therefore the capacitance of the capacitor of the invention over the surface area and capacitance of a capacitor having a standard HSG surface. In addition during the modified phosphorous deposition the phosphine dopant is driven into the surface of the HSG polysilicon, reducing or even eliminating the depletion effect. It is interesting to note that the Applicant's preliminary data shows no degradation of the remaining HSG poly as a result of the modified phosphine deposit or wet etch.

BRIEF DESCRIPTION OF THE DRAWINGS

FIG. 6 is a cross-sectional view of the DRAM cell of FIG. 5 following HSG poly deposition on the storage node base polysilicon layer.

FIG. 7 is an exaggerated enlarged cross-sectional view of a portion of the nucleated polysilicon layer of FIG. 6.

FIG. 8 is a cross-sectional view of the DRAM cell of FIG. 6 following a phosphine rich oxidation of the HSG poly layer.

FIG. 9 is an exaggerated enlarged cross-sectional view of a portion of the nucleated polysilicon layer and oxidation layer of FIG. 8.

FIG. 10 is a cross-sectional view of the DRAM cell of FIG. 8 following a wet etch to remove the oxidation layer.

FIG. 11 is an exaggerated enlarged cross-sectional view of a portion of the nucleated polysilicon layer FIG. 10.

DETAILED DESCRIPTION OF THE PREFERRED EMBODIMENTS

Figure 1:
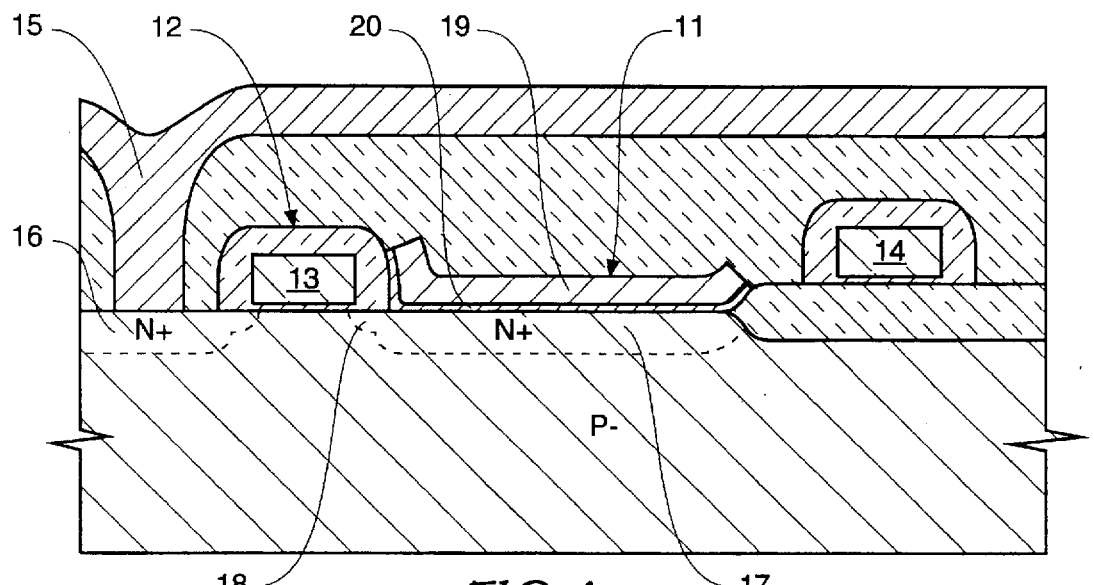
FIG. 1 is a cross-sectional view of a DRAM cell having a conventional planar capacitor of the related art.
Figure 2:
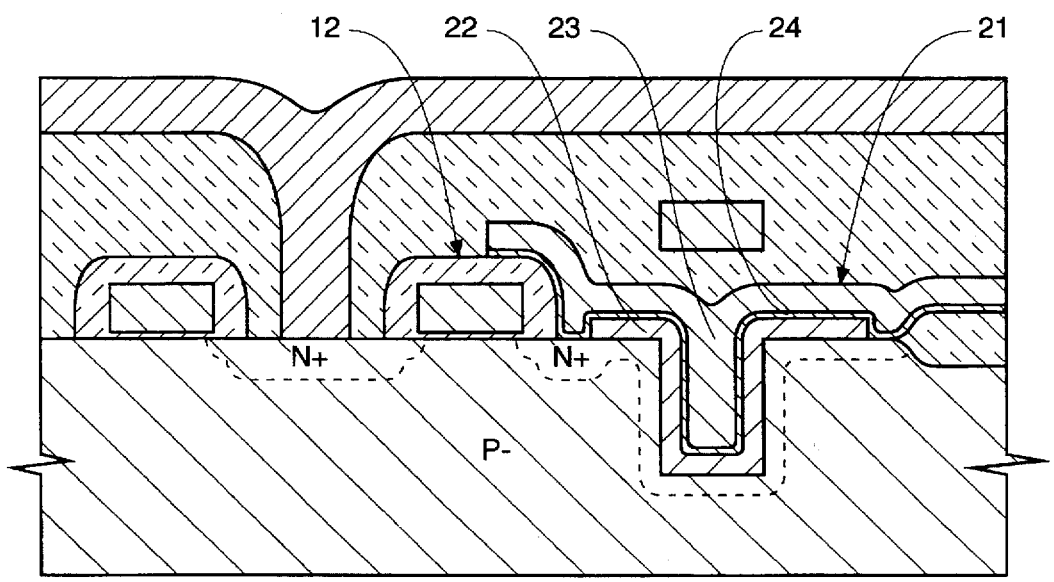
FIG. 2 is a cross-sectional view of a DRAM cell having a typical trench capacitor of the related art.
Figure 3:
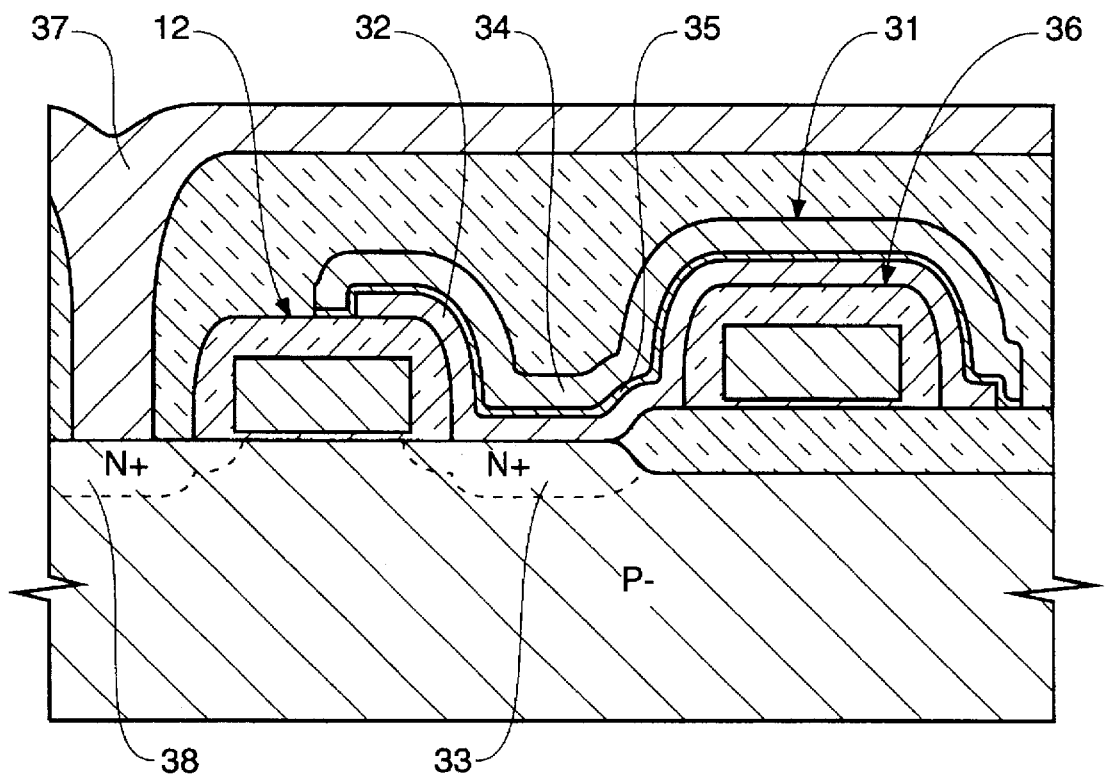
FIG. 3 is a cross-sectional view of a DRAM cell having a typical stacked capacitor of the related art.
Figure 4:
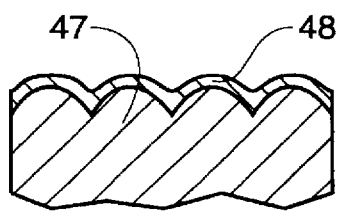
FIG. 4 is an exaggerated enlarged cross-sectional view of a DRAM storage node capacitor plate and dielectric layer of the related art.
Figure 5:
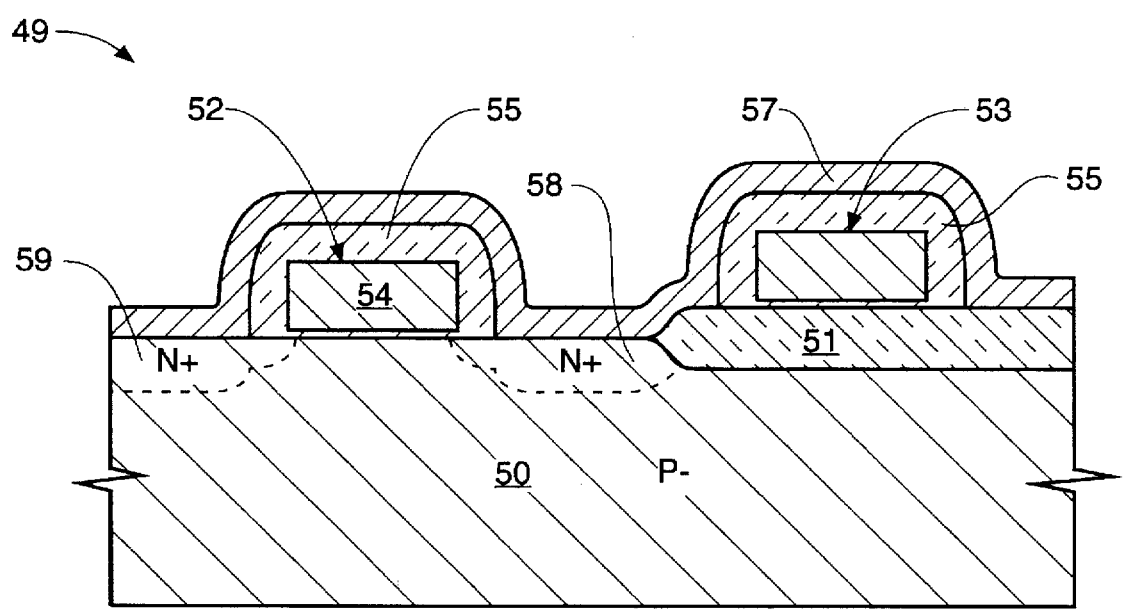
FIG. 5 is a cross-sectional view of a DRAM cell of a stacked capacitor of the invention during the fabrication process subsequent to the deposition of the storage node base polysilicon layer.

The invention is a capacitor and the method for forming the storage node of a capacitor. Referring to FIG. 5 a DRAM cell 49 of stacked capacitor design is shown during the early stages of the fabrication process. The stacked capacitor is fabricated to overlie a wafer substrate 50 of intrinsic polycrystalline silicon and to overlie a field oxide region 51 of the substrate 50. The cell's field-effect transistor (FET) 52 and wordline 53 have already been formed. The FET gate 54 and wordline 53 are covered on the top and sides by a silicon oxide spacer or nitride spacer layer 55. A first or base polysilicon layer 57 is deposited over the FET 52, the word line 53, the storage node junction 58, and the access node junction 59. The polysilicon layer 57 is then doped with phosphorus ions to produce an extrinsic conductive polysilicon layer.

Referring now to FIG. 6, a second polysilicon layer 58 is deposited. The pressure and temperature during the deposition of the second polysilicon layer 58 is adjusted until nucleation occurs forming hemispherical grains 59 of polysilicon. The nucleated second polysilicon layer is called hemispherical grain (HSG) polysilicon. The first 57 and second 58 polysilicon layers form the storage node capacitor plate of the storage node capacitor of the invention.

In an alternate method the HSG polysilicon is formed according to the following process developed by Nippon Electric Company called vacuum anneal. In this process only one layer of doped or undoped amorphous or polycrystaline silicon is deposited. The layer is subjected to a tightly controlled temperature and pressure to induce nucleation and form a rough surface.

FIG. 7 is an exaggerated enlarged cross-sectional view of a portion 60 of FIG. 6. Although the actual grains 59 may not be perfectly hemispherical as depicted in FIG. 7 they are configured similar to the exaggerated view of FIG. 7 and they tend to intersect one another at the surface of the first polysilicon layer 57.

Referring now to FIG. 8, portions of the second polysilicon layer 58 and portions of the first polysilicon layer 57 are consumed during an oxidation. The oxidation is performed in a diffusion tube in an oxygen/phosphine ambient which results in a phosphorous rich oxide layer 61 being grown overlying the first 57 and second 58 polysilicon layers. The oxidation time and the oxidation rate are controlled in order that the quantity of the portions of the first 57 and the second 58 polysilicon layers consumed during the oxidation increase the surface area of the storage node capacitor plate. As a result, portions of the grains 59 and portions of the first polysilicon silicon layer 57 are removed during the subsequent wet etch resulting in a decrease in the size of the grains 59 and an increase in the distance between the grains 59. In addition, the phosphorus is driven into the first 57 and second 58 polysilicon layers during the oxidation.

FIG. 9 is an exaggerated enlarged cross-sectional view of portion 60 of FIG. 8 showing the enhanced surface area of the storage node capacitor plate having smaller grains and a greater distance between the grains.

FIG. 10 is the DRAM cell of FIG. 8 following the removal of the phosphorous rich layer 61 with a wet etch.

Driving the phosphorous into the storage node capacitor plate overcomes a problem inherent in the formation of the second (hemispherical) polysilicon layer 58 over the first polysilicon layer 57. A layer of native oxide is formed between the two layers. This native oxide prohibits the movement of the dopants from the first polysilicon layer 57 layer into the second polysilicon layer which in turn causes a large depletion effect. Thus doping of the second polysilicon layer 58 during the growth of the phosphorous rich oxide layer reduces, and can even eliminated, depletion effects. Reduction of depletion effects is particularly important.

FIG. 11 is the exaggerated enlarged cross-sectional view of a portion 60 of FIG. 10 and has been drawn to show the native oxide layer 62.

Figure 12:
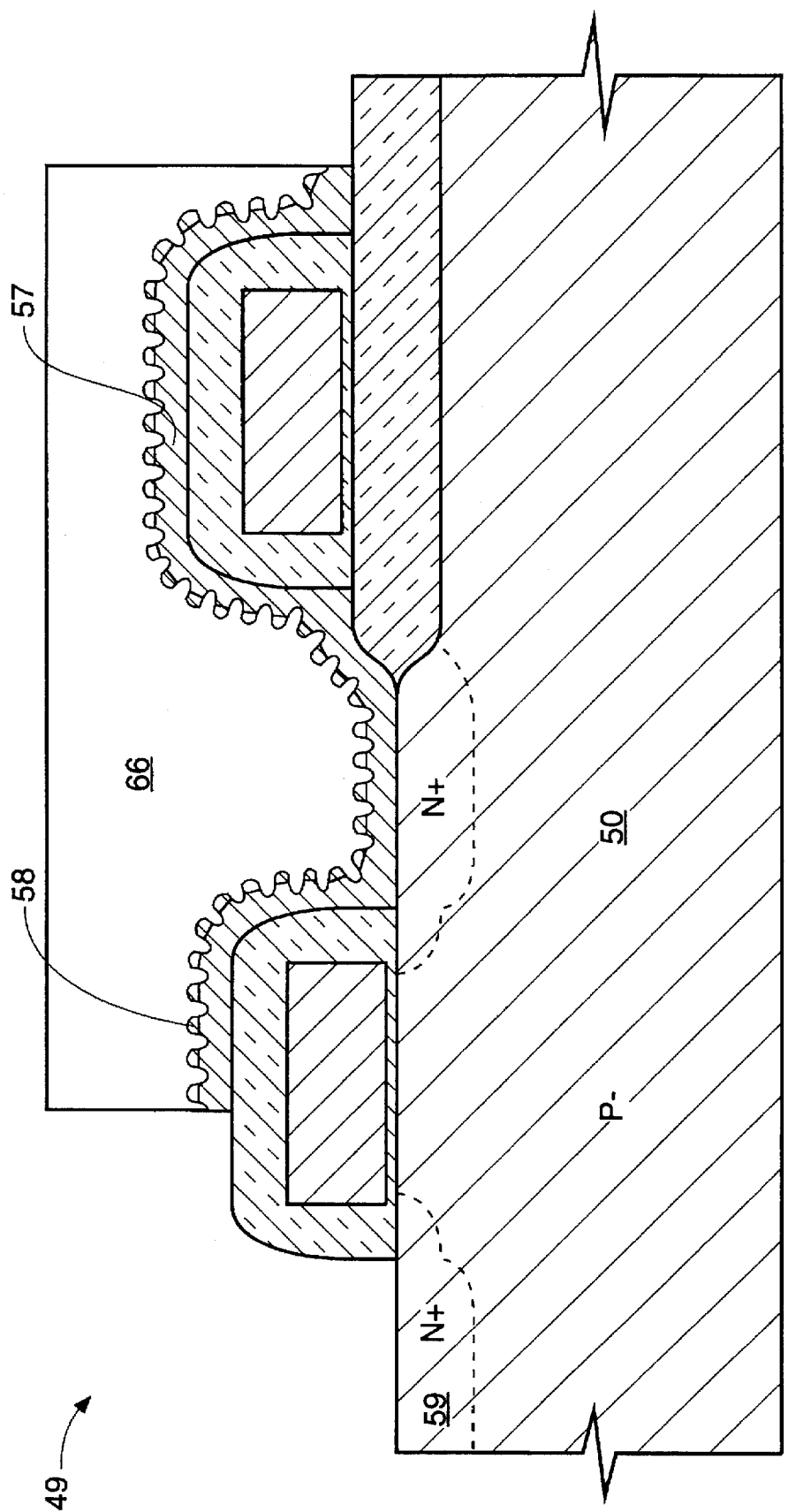
FIG. 12 is a cross-sectional view of the DRAM cell of FIG. 10 following the masking and etching of the base polysilicon layer and the HSG poly layer.

In FIG. 12 the first polysilicon layer 57 and the second polysilicon layer 58 are masked with mask 66 and etched in unmasked regions to define the storage node capacitor plate comprising first and second polysilicon layers 57 and 58.

Alternately, the oxidation and wet etch may be performed after the masking and etch of the first 57 and second 58 polysilicon layers.

Figure 13:
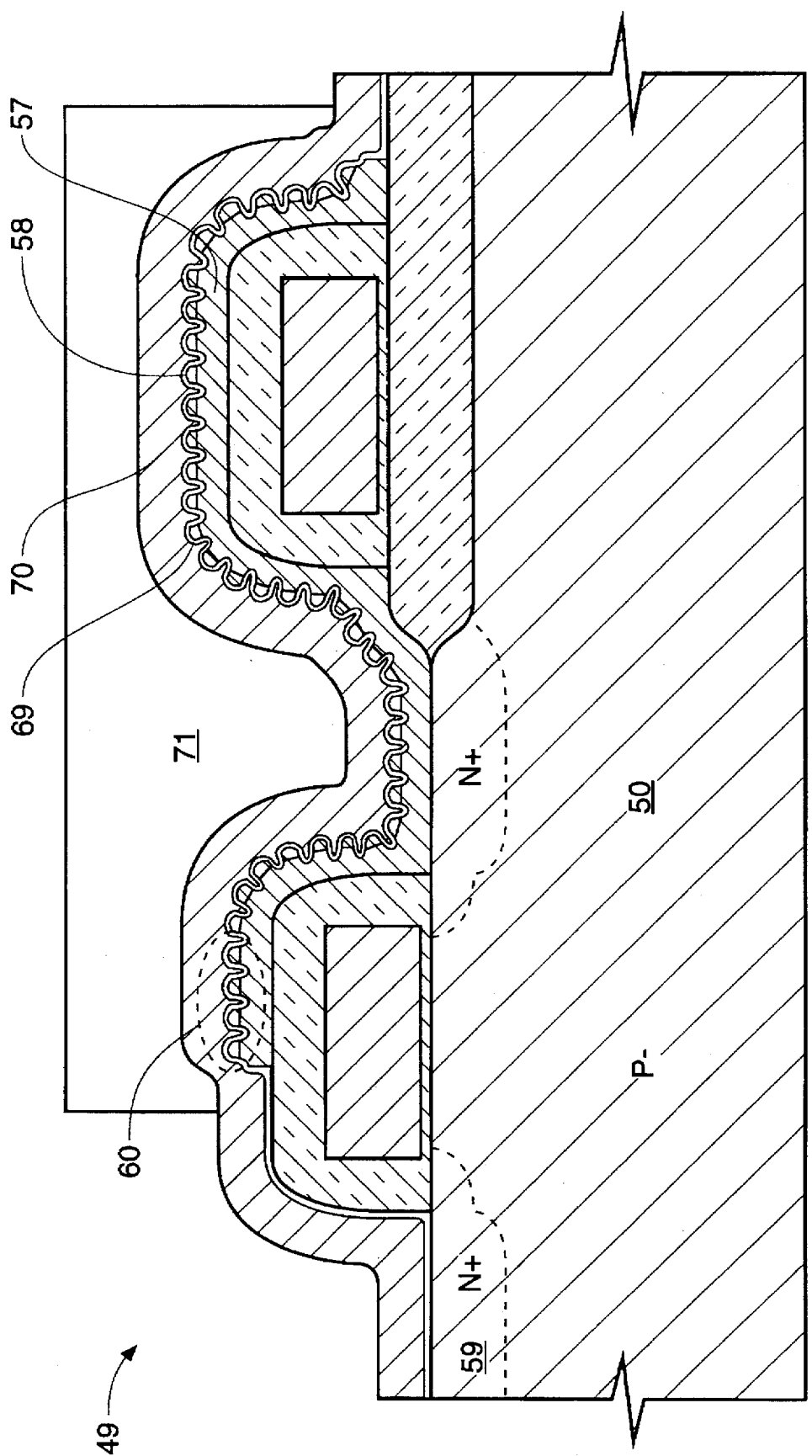
FIG. 13 is a cross-sectional view of the DRAM cell of FIG. 12 following the blanket deposition of a dielectric layer, the blanket deposition of a polysilicon cell plate layer, and the masking of the cell plate layer.

In FIG. 13 a dielectric layer 69 having good step coverage is deposited to overlie first 57 and second 58 polysilicon layers. Typically the dielectric layer 69 is silicon nitride having a thickness of approximately 80 Angstroms, although other dielectric materials and thicknesses maybe used. Due to the decreased size of the grains 59 and the increased distance between the grains 59 the thickness of the dielectric layer 69 can be selected in order that the thickness is approximately uniform on the entire surface area of the storage node capacitor plate. The dielectric deposition is followed by the blanket deposition of a polysilicon cell plate layer 70, the conductive doping of cell plate layer 70 with phosphorus, and the masking of the cell plate layer 70 with photomask 71.

Figure 14:
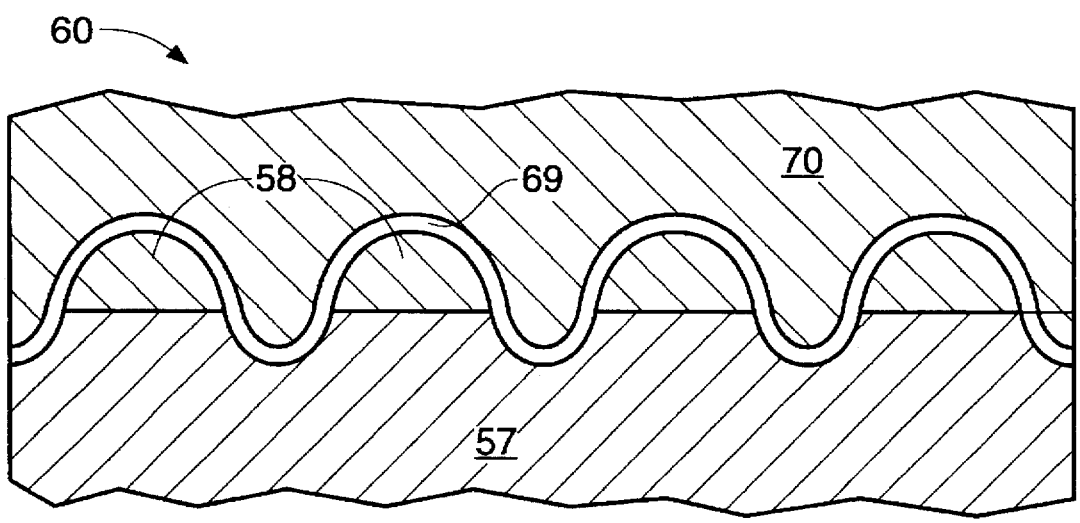
FIG. 14 is an exaggerated enlarged cross-sectional view of a portion of the DRAM cell of FIG. 13.

FIG. 14 is the exaggerated enlarged cross-section of portion 60 of FIG. 13. It can be seen that the thickness of the dielectric layer 69 is uniform, in this example 80 angstroms, over 100% of the surface of the second polysilicon layer 58 and over 100% of the surface of exposed portions of the first polysilicon layer 57.

Figure 15:
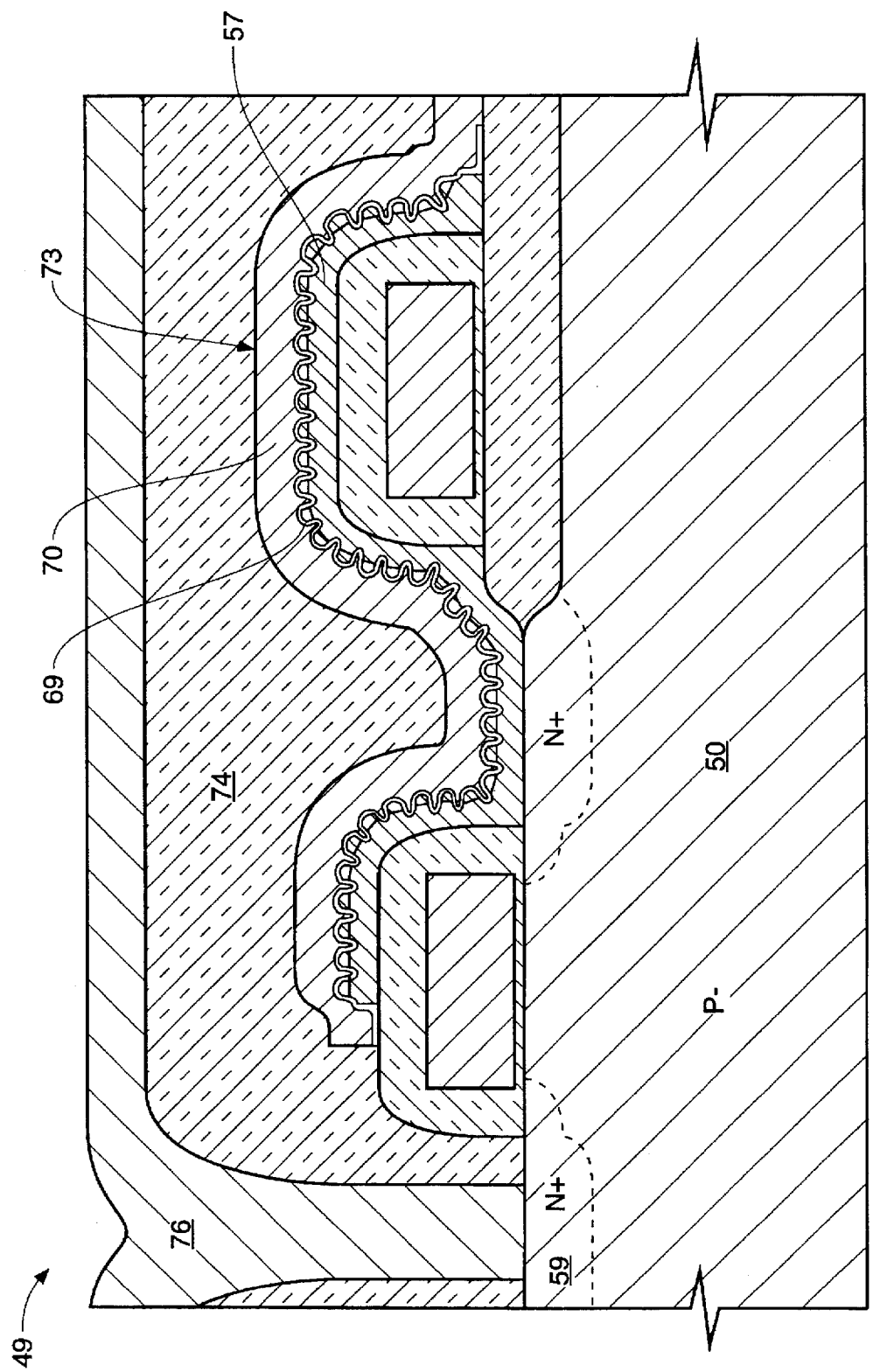
FIG. 15 is a cross-sectional view of the DRAM cell of FIG. 13 following the etching of the polysilicon cell plate layer and the formation of a bit line.

Referring now to FIG. 15, cell plate layer 70 and dielectric layer 69 have been etched forming the stacked capacitor of the invention. The process is completed with a conformal deposition of oxide 74 etched to expose access node junction 59. A bit line 76 is then deposited and patterned to contact the access node junction 59.

Figure 16:
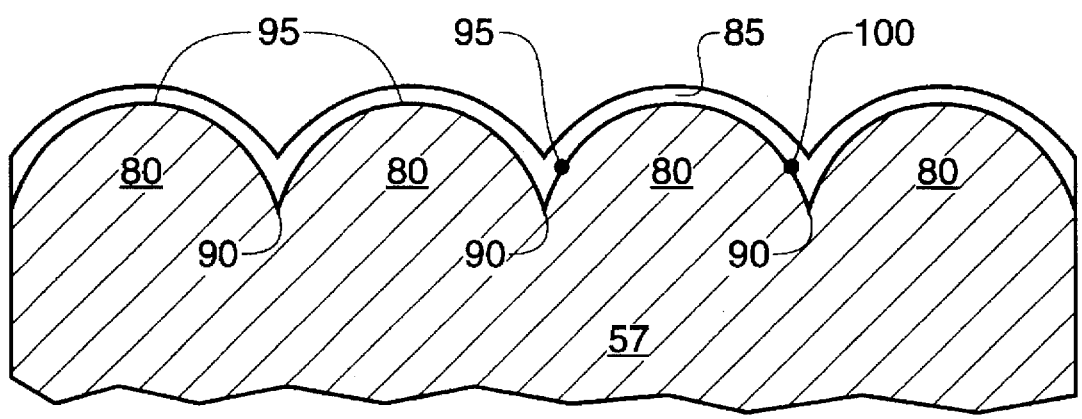
FIG. 16 is an exaggerated enlarged cross-sectional view of an HSG layer of the related art following a deposition of a dielectric layer.

FIG. 16 is an exaggerated enlarged cross-section of an unetched HSG polysilicon layer 80 with an overlying dielectric layer 85 of the related art. Even though the minimum thickness of the dielectric layer 85 is 80 angstroms, as is the dielectric layer 69 shown in FIG. 14, the dielectric bridges over the intersections 90. Therefore the dielectric interposed between two adjacent grains 95 is much thicker than 80 Angstroms. This results is less surface area being covered by dielectric having the minimum thickness. The distance covered by the dielectric 85 having minimum thickness is represented by the surface of the HSG polysilicon 80 interposed between points 95 and 100.

Thus by using the method of the invention the percentage of the surface area covered by a minimum thickness of dielectric can reach 100%. In some instances this 100% coverage is a 38% increase over methods which do not employ the method of the invention.

Experiments conducted by the Applicant provide data showing the effective elimination of the depletion effect in the storage node capacitor of the invention for a stacked capacitor and for a container capacitor. The data is shown graphically in FIG. 17 for the stacked capacitor and in FIG. 18 for the container capacitor. In both graphs capacitance is plotted against the bias voltage applied across a capacitor.

Figure 17:
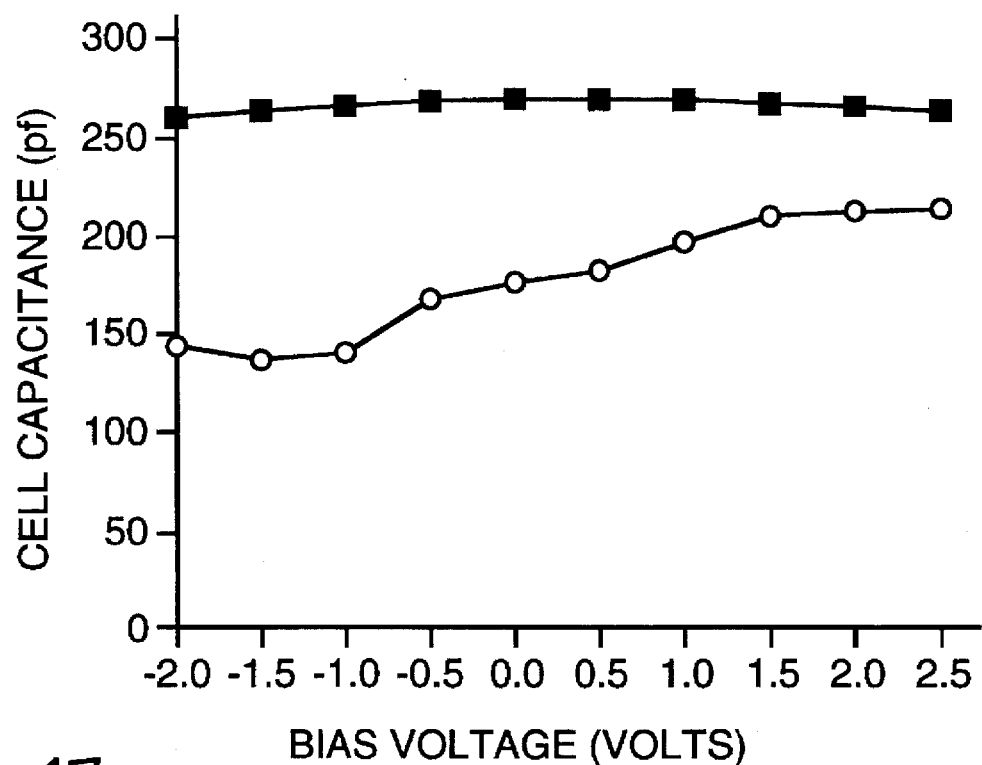
FIG. 17 is a graph depicting capacitance versus bias voltage for stacked capacitors.

In FIG. 17 the capacitance of a stacked capacitor fabricated having the doped HSG layer of the invention is represented by line A and is compared to the capacitance of a stacked capacitor having an undoped HSG layer, represented by line B. Both capacitors are biased with a voltage ranging from −2 volts to 2.5 volts. It can be seen that the capacitance of the stacked capacitor having the doped HSG layer remains almost constant, almost no depletion effect (only 3.7%), while the capacitance of the capacitor having an undoped HSG layer decreases significantly as the bias voltage decreases, indicating a significant depletion effect ((34.9%).

Figure 18:
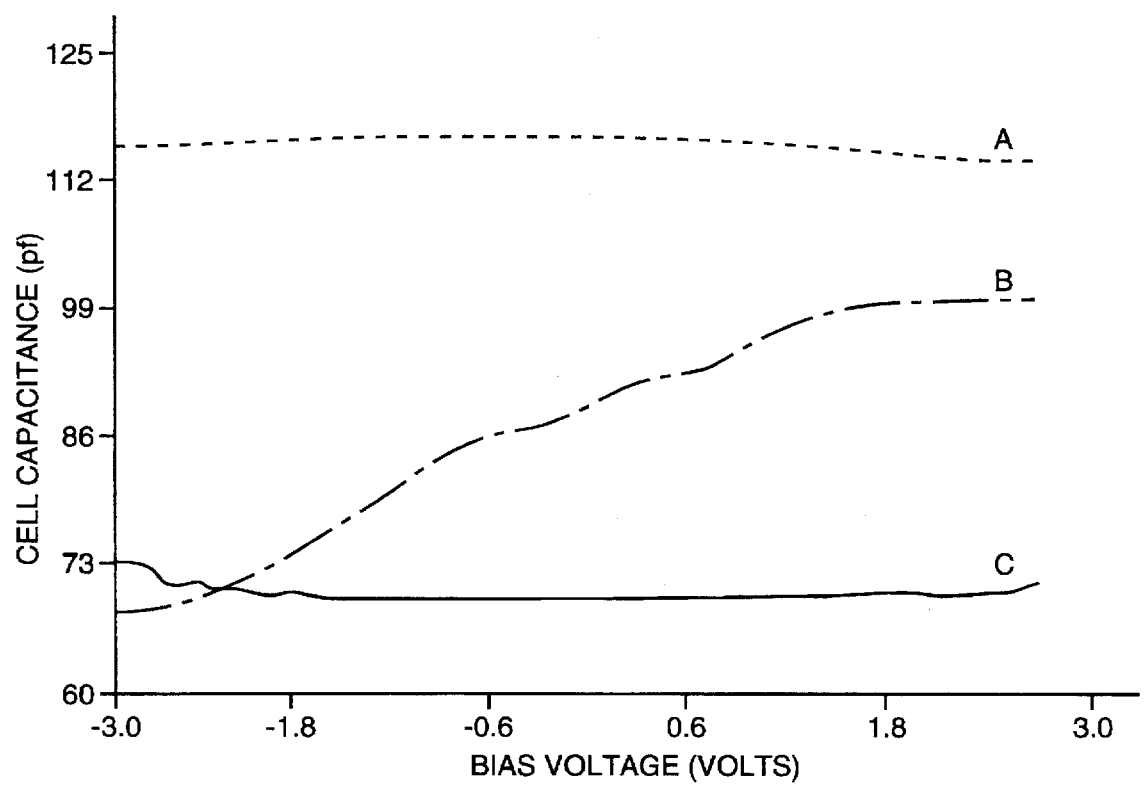
FIG. 18 is a graph depicting capacitance versus bias voltage for container cell capacitors.

FIG. 18 is a graph depicting capacitance versus bias voltage for container cell capacitors. The capacitance of container capacitors, having a 2 sided doped HSG polysilicon layer, one on either side of the base polysilicon layer, is represented by line A in FIG. 18; the capacitance of a container capacitor having undoped HSG polysilicon is represented by line B; and the capacitance of a container capacitor without an HSG layer is represented by line C. It can be seen the capacitance of the container capacitor having the doped HSG polysilicon layer is not only significantly greater than the capacitance plotted on lines B and C for the other capacitors, but there are almost no depletion effects for the container capacitor having the doped HSG polysilicon layer. In comparison the container capacitor having an undoped HSG polysilicon layer has a large depletion effect and the capacitor having no HSG polysilicon layer has a much lower capacitance.

The invention may also be implemented wherein the stacked capacitor is fabricated overlying the bit lines or for other types of capacitors, such as trench. Monocrystalline silicon may also be used in place of polycrystalline.

By decreasing the size of the grains and increasing the distance between them capacitance is increased. By increasing the doping of the HSG layer the capacitance is also increased and the depletion effects are minimized.

Although only a single embodiment of the invention has been described herein, it will be apparent to one skilled in the art that changes and modifications may be made thereto without departing from the spirit and the scope of the invention as claimed.

What is claimed is:

1. A method for forming a capacitor, comprising the following steps:
 a) forming a polysilicon layer having a hemispherical grained surface;
 b) oxidizing said polysilicon layer in an ambient comprising oxygen and a dopant to form an oxide layer comprising said dopant, said oxidizing consuming a portion of said polysilicon layer;

c) doping said polysilicon layer with said dopant; and d) etching said oxide layer to decrease a size of grains forming said hemispherical grained surface and to increase a distance between said grains, said polysilicon layer forming at least a portion of a storage node plate of said capacitor.

2. The method as specified in claim 1 further comprising the following steps:

a) forming a dielectric layer to overlie said polysilicon layer; and b) forming a cell plate layer to overlie said dielectric layer.

3. The method as specified in claim 2, further comprising the step of doping said cell plate layer to increase a conductivity thereof.

4. The method as specified in claim 1, wherein said step of forming said polysilicon layer comprises depositing said polysilicon layer at a temperature and a pressure effecting nucleation of said polysilicon layer.

5. The method as specified in claim 1, wherein said step of forming said dielectric layer comprises depositing a dielectric material to have a uniform thickness.

6. The method as specified in claim 1, wherein said step of forming said polysilicon layer comprises forming said polysilicon layer on a doped base polysilicon layer.

7. A method for forming a capacitor comprising the following steps:

a) providing a granulated first capacitive plate having a plurality of hemispherical grains on a surface thereof;

b) oxidizing a capacitive material comprising said first capacitive plate in an ambient comprising a dopant material and an oxygen source;

c) consuming portions of said capacitive material to decrease said size of said grains and to increase a distance between said grains;

d) forming an oxide layer comprising said dopant material adjacent to said capacitive material remaining subsequent to said step of oxidizing;

e) driving said dopant material into said capacitive material increasing a conductivity thereof;

f) removing said oxide layer;

g) forming a second capacitive plate; and h) forming a dielectric layer interposed between said first and said second capacitive plates.

8. A method for forming a capacitor, comprising the following steps:

a) forming a base layer on a starting surface, said base layer functioning as a storage node plate of said capacitor;

b) adjusting a temperature and a pressure of said base layer in order to cause a nucleation of said base layer;

c) forming hemispherical grains of said base layer on a surface of said base layer during said step of adjusting;

d) oxidizing said base layer in an oxygen ambient comprising dopant ions thereby forming an oxide layer;

e) driving said dopant ions into said base layer during said step of oxidizing, said dopant ions increasing a conductivity of said base layer;

f) consuming a portion of said base layer during said step of oxidizing thereby decreasing a size of said grains and increasing a distance between said grains;

g) removing said oxide layer;

h) forming a dielectric layer to overlie said base layer; and i) forming a cell plate layer to overlie said dielectric layer, wherein said base layer, said dielectric layer and said cell plate layer form said capacitor.

9. A method for forming a capacitor comprising the following steps:

a) forming a first polysilicon layer on a starting surface;

b) forming a second polysilicon layer having hemispherical grains overlying said first polysilicon layer;

c) oxidizing at least said second polysilicon layer in an oxygen and phosphorous ambient to form a phosphorous rich oxide layer comprising phosphorous ions, said step of oxidizing consuming a portion of each of said hemispherical grains to decrease a size of said grains and to increase a distance between said grains;

d) driving at least a portion of said phosphorous ions into said second polysilicon layer to dope said second polysilicon layer and to increase a conductivity thereof during said step of oxidizing, said first polysilicon layer and said doped second polysilicon layer forming a storage node plate of said capacitor; and (e) etching said oxide layer to remove said oxide layer.

10. The method as specified in claim 9, further comprising oxidizing a portion of said first polysilicon layer lying between said grains.

11. The method as specified in claim 9, further comprising the following steps:

a) forming a cell plate layer; and b) forming a dielectric layer interposed between said storage node plate and said cell plate.

12. The method as specified in claim 11, further comprising doping said cell plate layer and said first polysilicon layer to increase conductivities thereof.

13. The method as specified in claim 9, wherein said step of forming said second polysilicon layer comprises depositing said second polysilicon layer at a temperature effecting nucleation of said second polysilicon layer.

14. The method as specified in claim 9, wherein said step of forming said dielectric layer comprises depositing a dielectric material to have a uniform thickness.

15. A method for forming a capacitor, comprising the following steps:

a) depositing a first polysilicon layer on a starting surface;

b) doping said first polysilicon layer to increase a conductivity thereof;

c) depositing a second polysilicon layer to overlie said first polysilicon layer;

d) adjusting a temperature and a pressure of said second polysilicon layer during said step of depositing in order to cause a nucleation thereof;

e) forming hemispherical grains of said second polysilicon layer during said step of adjusting;

f) providing an oxygen and phosphorous ambient;

g) oxidizing portions of said first and said second polysilicon layers in said ambient to form an oxide layer comprising phosphorous ions, said oxidizing consuming said portions to decrease a size of said grains and to increase a distance between said grains;

h) driving at least a portion of said phosphorous into said second polysilicon layer during said step of oxidizing to increase a conductivity of said second polysilicon layer;

i) performing a wet etch to remove said oxide layer;

j) forming a dielectric layer to overlie said first and said second polysilicon layers; and k) forming a cell plate layer to overlie said dielectric layer, wherein said first and said second polysilicon layers comprise a storage node plate of said capacitor.

16. The method as specified in claim 15, further comprising controlling said step of oxidizing to control a consumption of said first and said second polysilicon layers such that a surface area of said storage node plate is enhanced thereby increasing capacitance.

* * * * *